United States Patent [19]
Jack et al.

[11] Patent Number: 5,808,329
[45] Date of Patent: Sep. 15, 1998

[54] LOW LIGHT LEVEL IMAGER WITH EXTENDED WAVELENGTH RESPONSE EMPLOYING ATOMIC BONDED (FUSED) SEMICONDUCTOR MATERIALS

[75] Inventors: Michael D. Jack, Goleta; Ken J. Ando, Santa Barbara; Kenneth Kosai, Goleta; David R. Rhiger, Santa Barbara, all of Calif.

[73] Assignee: Raytheon Company, Lexington, Mass.

[21] Appl. No.: 680,096

[22] Filed: Jul. 15, 1996

[51] Int. Cl.$^6$ ............... H01L 31/0328; H01L 31/0336; H01L 31/072; H01L 31/109

[52] U.S. Cl. ............... 257/188; 257/189; 257/226; 257/228

[58] Field of Search ............... 257/222, 226, 257/184, 188, 189, 441, 442, 291, 292, 233, 228

[56] References Cited

U.S. PATENT DOCUMENTS

| | | | |
|---|---|---|---|
| 4,228,365 | 10/1980 | Gutierrez et al. | 257/188 X |
| 4,257,057 | 3/1981 | Cheung et al. | 257/188 X |
| 4,952,995 | 8/1990 | Phillips et al. | 257/226 X |
| 5,432,374 | 7/1995 | Norton | 257/442 |
| 5,543,641 | 8/1996 | Wadsworth et al. | 257/226 |

OTHER PUBLICATIONS

Hawkins et al., Leos '95, IEEE Lasers and Electro–Optics Society 1995 Annual Meeting, 8th Annual Meeting, Conference Proceedings (Cat. No.95CH35739) Part vol. 1, pp. 29–30 vol. 1, "Silicon Hetero–Interface Photodetector".

"Low threshold, wafer fused long wavelength vetical cavity lasers", J. J. Dudley et al.,Appl. Phys. Lett. 64, Mar. 21, 1994.

"Analysis of wafer fusing for 1.3pm vertical cavity surface emitting lasers", R.J. Ram et al, Appl. Phys. Lett. 62, May 17, 1993.

Electrical characteristics of directly–bonded GaAs and InP, Hiroshi Wada et al., Appl. Phys. Lett. 62, Feb. 15, 1993.

Wafer fusion: A novel technique for optoelectronic device fabrication and monolithic integration, Z. L. Liau et al., Appl. Phys. Lett. 56, Feb. 19, 1990.

"High Quantum Efficiency and Narrow Absorption Bandwidth of the Wafer–Fused Resonant $In_{0.53}Ga_{0.47}$As Photodetectors", I–Hsing Tan et al., IEEE Photonics Technology Letters, vol. 6, No. 7, Jul. 1994.

Modeling and Performance of Wafer–Fused Resonant–Cavity Enhanced Photodectors, I–Hsing et al. IEEE Journal of Quantum Electronics, vol. 31, No. 10, Oct. 1995.

*Primary Examiner*—William Mintel
*Attorney, Agent, or Firm*—W. C. Schubert; G. H. Lenzen, Jr.

[57] ABSTRACT

An imaging device (10, 10') has a plurality of unit cells (11) that contribute to forming an image of a scene. The imaging device includes a layer of wide bandgap semiconductor (18) material (e.g., silicon) having photogate charge-mode readout circuitry (20, 22, 24), such as CCD or CMOS circuitry, disposed upon a first surface of the layer. In one embodiment a second, opposing surface of the layer is bonded at a heterojunction interface or atomic bonding layer (16) to a surface of a layer of narrower bandgap semiconductor material (e.g., InGaAs or HgCdTe), that is selected for absorbing electromagnetic radiation having wavelengths longer than about one micrometer (i.e., the NIR or longer) and for generating charge carriers. The generated charge carriers are transported across the heterojunction interface for collection by the photogate charge-mode readout circuitry. The layer of narrower bandgap material may be disposed upon a surface of a transparent substrate, and also may be differentiated into a plurality of mesa structures (14a). In further embodiments the absorbing layer may have an equivalent or a wider bandgap than the layer having the readout circuitry.

17 Claims, 5 Drawing Sheets

LOW LIGHT LEVEL IMAGER WITH EXTENDED WAVELENGTH RESPONSE EMPLOYING ATOMIC BONDED (FUSED) SEMICONDUCTOR MATERIALS

FIELD OF THE INVENTION

This invention relates generally to detectors of electromagnetic radiation and, in particular, imaging devices constructed with semiconductor materials and to methods for fabricating same.

BACKGROUND OF THE INVENTION

Image intensifiers and conventional backside illuminated silicon-based charge coupled devices (CCDs) are commonly used as detectors of electromagnetic radiation. However, these conventional devices are limited in wavelength response to, typically, the visible range (i.e., approximately 0.4 micrometers to approximately 0.8 micrometers). More particularly, these conventional detectors are not sensitive to the infrared radiation (IR) range, such as the near-IR (NIR) (i.e., approximately 0.8 micrometers to 2.0 micrometers). This is a distinct disadvantage for many applications, in particular for so-called low light level (LLL) applications, since the night sky is characterized by a significant NIR illumination.

However, conventional CCD detectors do provide the advantage of a relatively simple, low noise read-out structure, wherein the low noise read-out is inherent in the direct collection of charge under an integrating gate. More particularly, conventional CMOS or CCD imagers collect charge carriers directly under a photogate structure, which enables the resetting of each pixel element by a "noiseless" transfer of charge, rather than a conventional voltage mode resetting operation that is employed in conventional IR detectors. Such a charge collection scheme is not possible to implement in conventional hybrid IR Focal Plane Array (FPA) technology, except by direct injection through a transistor. However, the direct injection technique fails at very low light levels where transistor resistances become exceedingly high, with a resulting degradation of injection efficiency.

OBJECTS OF THE INVENTION

It is a first object of this invention to provide an improved imaging device that is capable of detecting electromagnetic radiation within two spectral regions, such as the visible and the infrared.

It is second object of this invention to provide low light level imaging device that has a significant sensitivity in the NIR band, and that furthermore employs a low noise CCD or CMOS-type of read-out structure.

It is a further object of this invention to provide an improved imaging device that has significant sensitivity at low light levels, and that is comprised of a plurality of semiconductor types, having dissimilar bandgaps, that are atomically bonded together.

SUMMARY OF THE INVENTION

The foregoing and other problems are overcome and the objects of the invention are realized by methods and apparatus in accordance with embodiments of this invention.

In accordance with one aspect of this invention there is provided an imaging array comprised of bonded semiconductor materials of possibly dissimilar bandgaps and atomic spacing, wherein an optical generation of charge carriers in one semiconductor material results in the collection, transport, processing and electrical or optical output of charge carriers in a second semiconductor material.

This invention may employ a direct field or diffusion-based transport from one semiconductor material to another semiconductor material without intervening wire bonding, bump hybridization, or interconnection through gate or diode transistor modulation. An imager device in accordance with this invention enables a scene to be imaged at the wavelengths sensed by a silicon (or other wide bandgap semiconductor) CCD or CMOS circuit, and also at longer wavelengths sensed by a bonded IR-responsive absorbing layer, such as a layer of Group III–V or Group II–VI semiconductor material. By example, the Group II–VI semiconductor material may be responsive to NIR ($\approx$0.8–2 $\mu$m), SWIR ($\approx$1–3 $\mu$m), MWIR ($\approx$3–5 $\mu$m); LWIR ($\approx$8–12 $\mu$m) or VLWIR ($\approx$12–25 $\mu$m).

The teachings of this invention have application to an extension of silicon-based LLL CCD technology to detection of longer (e.g., NIR) wavelengths, and also to the formation of silicon-based CMOS imagers having IR detection capability.

A radiation detector constructed in accordance with the teachings of this invention employs heterojunction bonding to form two-dimensional imaging arrays, and may be optimized for LLL imaging through a choice of semiconductor materials. A radiation detector constructed in accordance with the teachings of this invention may further employ bandgap engineering of two selected semiconductor materials through controlled epitaxial growth and appropriate doping to facilitate electronic transport.

In accordance with a method taught by this invention there are performed the steps of: (a) processing of one or both semiconductor materials to form active imaging circuits and any required electrical contacts; (b) further processing the semiconductor materials through thinning and surface preparation techniques; (c) atomically bonding the two processed semiconductor materials; and (d) completing any remaining processing steps, such as adding contacts and metallization.

The imaging structure in accordance with this invention extends conventional silicon-based CCD detection to longer IR wavelengths, while preserving the low noise operation inherent in CCD read-out structures. The imaging structure, when implemented as a CCD, thus overcomes the wavelength limitations of conventional silicon or GaAs CCDs, while preserving the low noise operation of these devices, and while enabling the range of detectable wavelengths to be extended into the NIR, SWIR, MWIR, LWIR or VLWIR spectral regions of a bonded, optically active IR-responsive layer.

Furthermore, both CMOS and CCD implementations of this invention benefit through the collection of charge carriers directly under a photogate structure, which enables the resetting of each pixel element by a "noiseless" transfer of charge, rather than the conventional voltage mode resetting operation that is employed in conventional IR detectors. The elimination of reset or "KTC" noise for low light levels, in either the CMOS or CCD mode of operation, thus enables operation at very low levels of sensitivity, for example, in the 1–100 electron range.

In addition, backside illuminated embodiments of this invention are capable of providing quantum efficiencies in excess of 90%, thereby enabling an operation that approaches a "photon" counter.

Furthermore, by adjusting the magnitude of electric fields across the structure by means of photogate bias potentials, the structure may be operated as an Avalanche Photodiode Imager (API). That is, amplification of the charge carrier signal is achieved through avalanche multiplication.

By generating electrons and holes in a narrow bandgap material (e.g., a bonded layer of Group II–VI or Group III–V material), and then collecting the electrons in a wider bandgap material (e.g., p-silicon), a low noise avalanche gain (excess noise factor, F<4) can thus be achieved. Noise is further reduced by a negative feedback enabled by the collection of charge carriers under the integrating gate.

Finally, the heterojunction bonded structure in accordance with this invention may replace conventional bump interconnections that are common to IR-FPAs, and enables electronic interconnections (i.e. bonded mesas) on a wafer scale level. The wafer scale level implementation beneficially reduces the cost of the bonding, which is conventionally done instead at the individual die level.

In view of the foregoing, it should be apparent that this invention teaches, in one aspect, an imaging device that has a plurality of unit cells that contribute to forming an image of a scene. The imaging device includes a layer of wide bandgap semiconductor material (e.g., silicon) having photogate charge-mode readout circuitry, such as CCD or CMOS circuitry, that is disposed upon a first surface of the layer. A second, opposing surface of the layer is bonded at a heterojunction interface to a surface of a layer of narrower bandgap semiconductor material (e.g., InGaAs or HgCdTe) that is selected for absorbing electromagnetic radiation having wavelengths longer than about one micrometer (i.e., the NIR or longer) and for generating charge carriers. The generated charge carriers are transported across the heterojunction interface for collection by the photogate charge-mode readout circuitry. The layer of narrower bandgap material may be disposed upon a surface of a transparent substrate, and also may be differentiated into a plurality of mesa structures. In further embodiments of this invention the radiation absorbing layer may have an equivalent bandgap or a wider bandgap than the layer that includes the low noise, charge mode photogate readout circuitry.

BRIEF DESCRIPTION OF THE DRAWINGS

The above set forth and other features of the invention are made more apparent in the ensuing Detailed Description of the Invention when read in conjunction with the attached Drawings, wherein.

DETAILED DESCRIPTION OF THE INVENTION

Figure 1A:
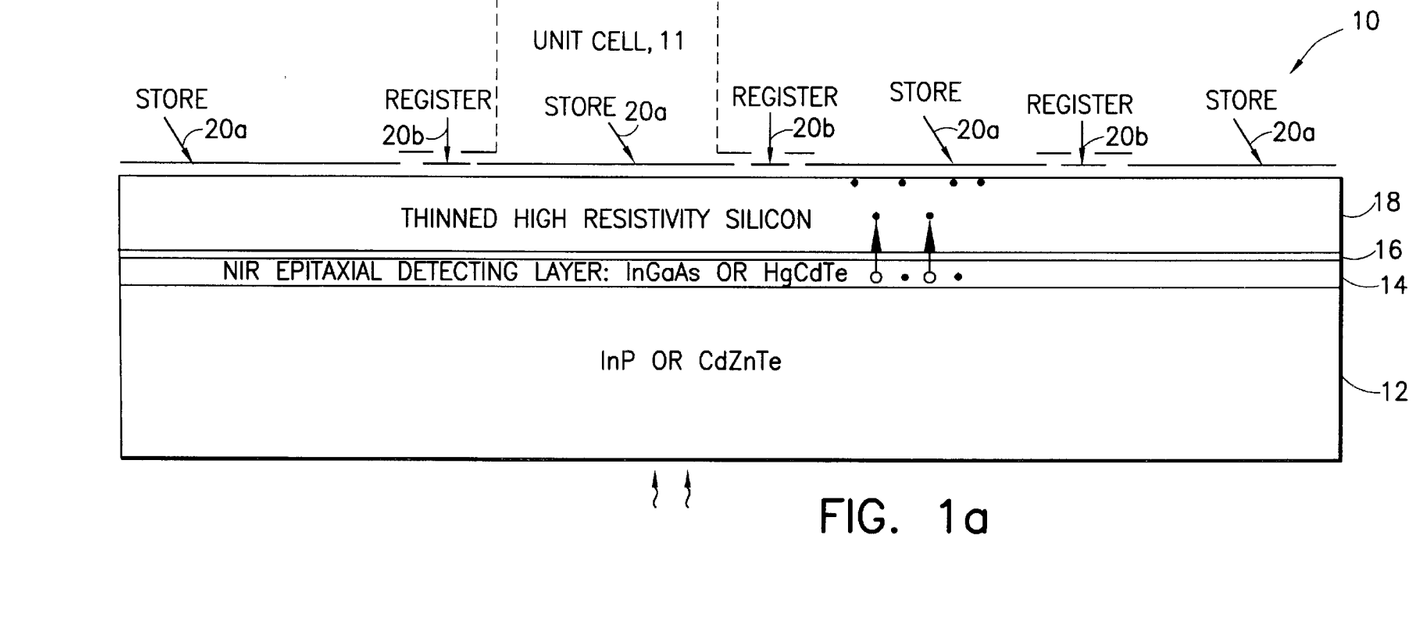
FIG. 1a is an enlarged, cross-sectional view (not to scale) of a CCD embodiment of a heterojunction bonded imager in accordance with a first embodiment of this invention.

FIG. 1a illustrates a backside illuminated, CCD embodiment of a heterojunction bonded imager 10. The imager 10 includes a transparent substrate 12, a NIR-responsive detecting layer 14 that is epitaxially grown on the substrate 12, an atomic bonding layer or interface 16, and a thin, high resistivity silicon layer 18. By example, and for a Group III–V embodiment, the substrate 12 is comprised of InP and the epitaxial detecting layer 14 is comprised of InGaAs. Further by example, and for a Group II–VI embodiment, the substrate 12 is comprised of CdZnTe and the epitaxial detecting layer 14 is comprised of HgCdTe. A suitable thickness for the detecting layer 14 is in the range of about one to ten micrometers, the actual thickness being a function at least in part of the IR wavelength band that is desired to be detected, while ten micrometers is a suitable thickness for the silicon layer 18. The top surface of the silicon layer 18, in this embodiment of this invention, is patterned into a conventional CCD read-out structure, and includes photogate metallization 20a (Store), under which charge carriers are collected, and transfer gate metallization 20b (Register), which transfers the collected charge carriers to amplifying circuitry (not illustrated) of known construction. Each photogate 20a can be considered to define one pixel or scene unit cell 11 of the imager 10, which can be arranged in a linear or two-dimensional array of unit cells. Visible and IR radiation, such as NIR radiation, are incident on the backside of the imager 10 and pass substantially unabsorbed through the substrate 12. The NIR (and shorter wavelength radiation i.e. visible or UV) is absorbed in the narrower bandgap detecting layer 14. The photoinduced charge carriers from the NIR detecting layer 14 pass through the thin atomic bonding layer 16, and are collected at respective ones of the photogates 20a. The collected charge is then subsequently transferred out of the photogates 20a by the associated transfer gates 20b.

Figure 1B:
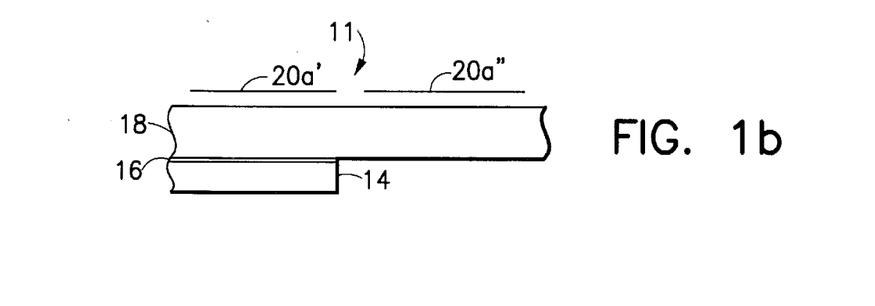
FIG. 1b is an enlarged, partial cross-sectional view (not to scale) of a second (two color) embodiment of a CCD heterojunction bonded imager in accordance with this invention.

Color separation (NIR from visible) can be implemented by selective removal of the NIR (e.g., InP) substrate, as is illustrated in FIG. 1b. An example is a single pixel with two collecting photogates 20a (designated 20a' and 20a"). Under one photogate the silicon (20a') and NIR layers are intact. In this case photoinduced carriers from both visible and NIR radiation are collected. Under the second photogate (20a") within the same pixel the NIR layer is selectively removed (subsequent to a removal of the substrate 12). In this case only photoinduced carriers from visible radiation are collected by the photogate 20a". Two signals (one from visible only, the second from the sum of visible and NIR radiation) are then generated in each unit cell 11 and may be read out in parallel or subtracted to yield separate signals for NIR and visible radiation.

An important feature of the imager 10 is the presence of the atomic bonding layer 16, which enables the two dissimilar semiconductor material types (e.g., silicon and HgCdTe or InGaAs) to be physically and electrically coupled together, while compensating for lattice and energy bandgap mismatches between the two dissimilar semiconductor materials. The use of fusing to join dissimilar semiconductor materials for constructing optical detectors and sources is known in the art, as evidenced by, for example, the following publications: L. H. Tan et al., "High quantum efficiency and narrow absorption bandwidth of the wafer-fused resonant $In_{0.69}Ga_{0.47}As$ photodetectors", IEEE Photon. Technol. Lett., vol. 6, pp. 811–813, 1994; Z. L. Liau, et al., "Wafer fusion: A novel technique for optoelectronic device fabrication and integration," Appl. Phys. Lett., vol. 56, pp. 737–739, 1990; H. Wada, et al. "Electrical characteristics of directly-bonded GaAs and InP," Appl. Phys. Lett., vol. 62, pp. 738–740, 1993; R. J. Ram, et al., "Analysis of wafer fusing for 1.3 μm vertical cavity surface emitting lasers," Appl. Phys. Lett., vol. 62, pp. 2474–2476, 1993; J. J. Dudley, et al., "Low threshold, wafer fused long wavelength vertical cavity lasers, " Appl. Phys. Lett., vol. 64, pp. 1–3, 1994; and I. H. Tan, et al., "Modeling and performance of wafer-fused resonant-cavity enhanced photodetectors," IEEE J. Quantum Electron., vol. 31, pp. 1863–1875, 1995.

The imager 10, which employs the fusing of two dissimilar semiconductors, enables operation of the imager 10 with the low noise inherent in a charge mode collection and read-out technique, while also extending the cutoff wavelength of the silicon-based CCD detector to that of the bonded detecting layer 14.

Figure 4A:
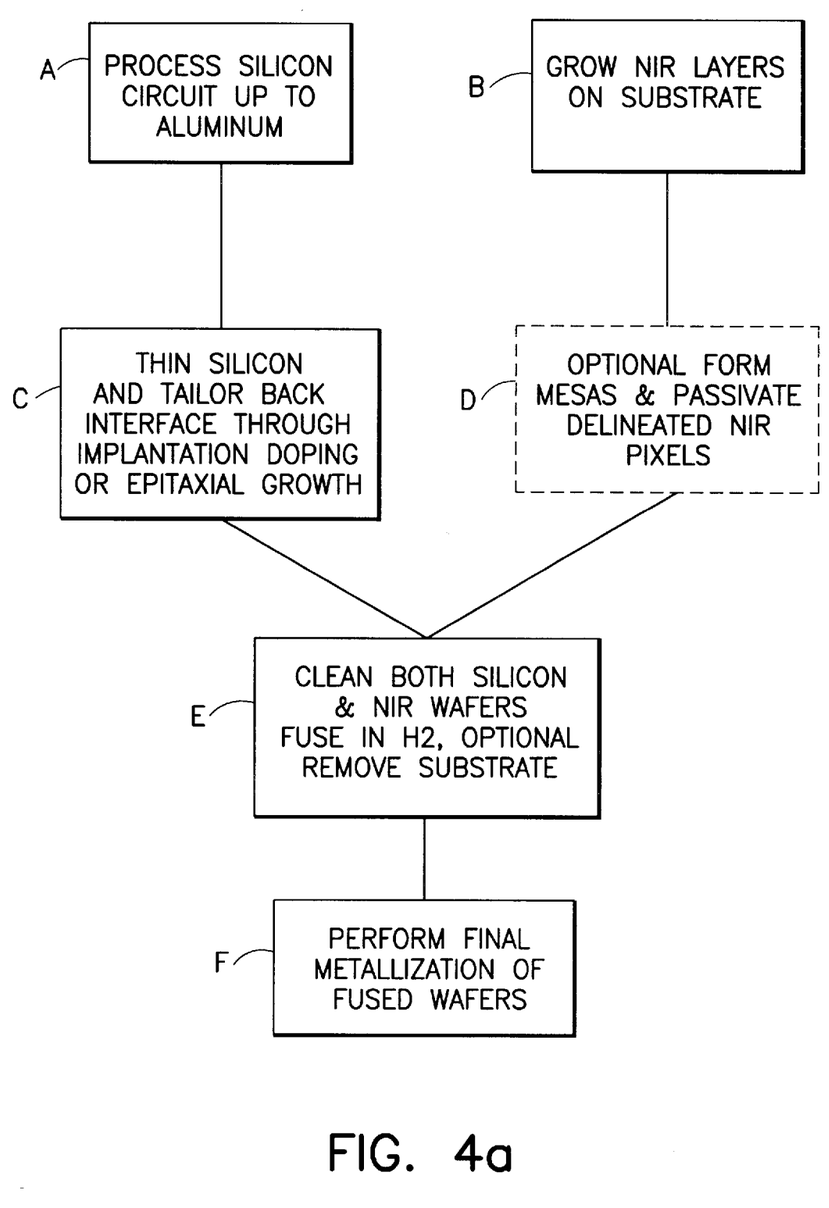
FIG. 4a is representative process flow diagram in accordance with a first method of this invention.

The processing of the imager 10 is illustrated in FIG. 4a. In general, the construction of the imager 10 includes the doping of the silicon layer 18 and the detecting layer 14 to facilitate charge transfer between these two layers at low illumination levels. The construction further includes the thinning of the silicon CCD layer 18 (prior to final metallization when the bonding temperature is >450 C.), the bonding to the detecting layer 14 (in a hydrogen environment), and the final processing of the composite structure which can include photolithography and the etching of contacts, metallization, etc.

Figure 5:
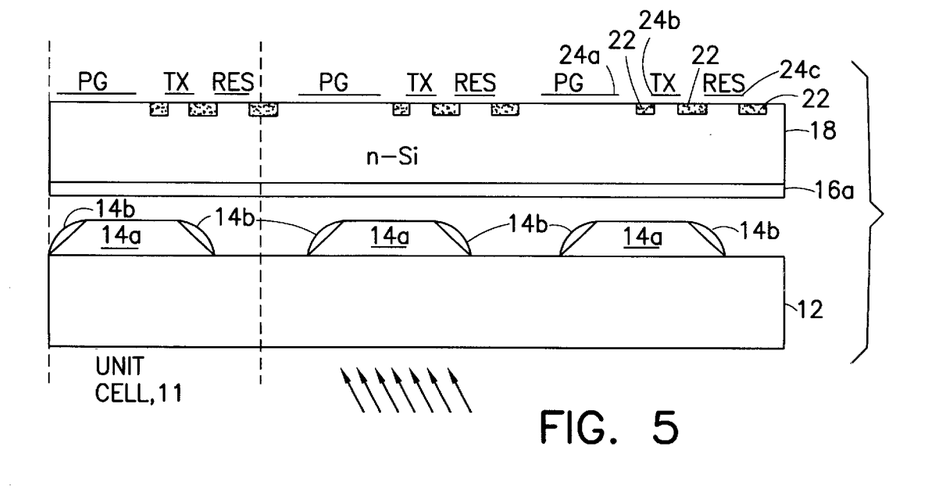
FIG. 5 is an enlarged, cross-sectional view (not to scale) of a heterojunction bonded imager having mesa-processed detecting and read-out layers, the Figure illustrating the avoidance of conventional bump technology for joining two dissimilar semiconductor materials.

More particularly, at Block A the method processes a high resistivity silicon substrate to form the required silicon CCD or CMOS circuits and gate structures using conventional polysilicon and electrode and gate oxide layers. At Block B the method forms the narrower bandgap detecting layer 14 by the epitaxial growth (e.g., MBE, MOCVD) of the detecting layer 14 to a desired thickness on one surface of the substrate 12. The exposed surface of the detecting layer 14 can then be further processed to provide grading and doping to optimize the transport of charge carriers across the subsequently formed atomic bonding layer interface. A back-contact layer (if desired) can be formed on the opposite surface of the substrate. Alternatively the substrate may be etched off exposing a back contact layer, for example a p+ layer specifically grown. Also if desired the detecting layer 14 can be further processed to form upstanding mesa structures, Block D, (as illustrated in FIG. 5), which is beneficial when transport is due to diffusion-limited collection of charge carriers. In this case mesa delineation serves to minimize electrical crosstalk. After delineation of the mesas, passivation may be applied to the edges to minimize dark current of the exposed narrow gap material. Passivation is then removed from the top of the mesa. The mesa tops are subsequently fused to the silicon to enable current transport (Block E). At Block C the silicon substrate upon which the CCD or CMOS circuits have been formed in Block A is thinned to a nominal 10 micrometer thickness. The surface opposite the CCD or CMOS circuits is next ion implanted and then annealed to activate the implanted doping layer. At Block E the thinned silicon layer 18 is bonded to the detecting layer 14 in a $N_2$ or Hg atmosphere (or in vacuum) by the application of pressure at a temperature greater than 400 C. to effect chemical bonding.

If desired, the substrate 12 can also be thinned or etched away completely exposing the detecting layer. This process enables detection of wavelengths shorter than the cutoff of the InP substrate. In the original case carriers generated in the substrate may recombine or be lost. With the substrate etched off, the carriers generated in the NIR layer as a result of radiation ranging from UV through the NIR "cutoff" are collected by the silicon.

Figure 4B:
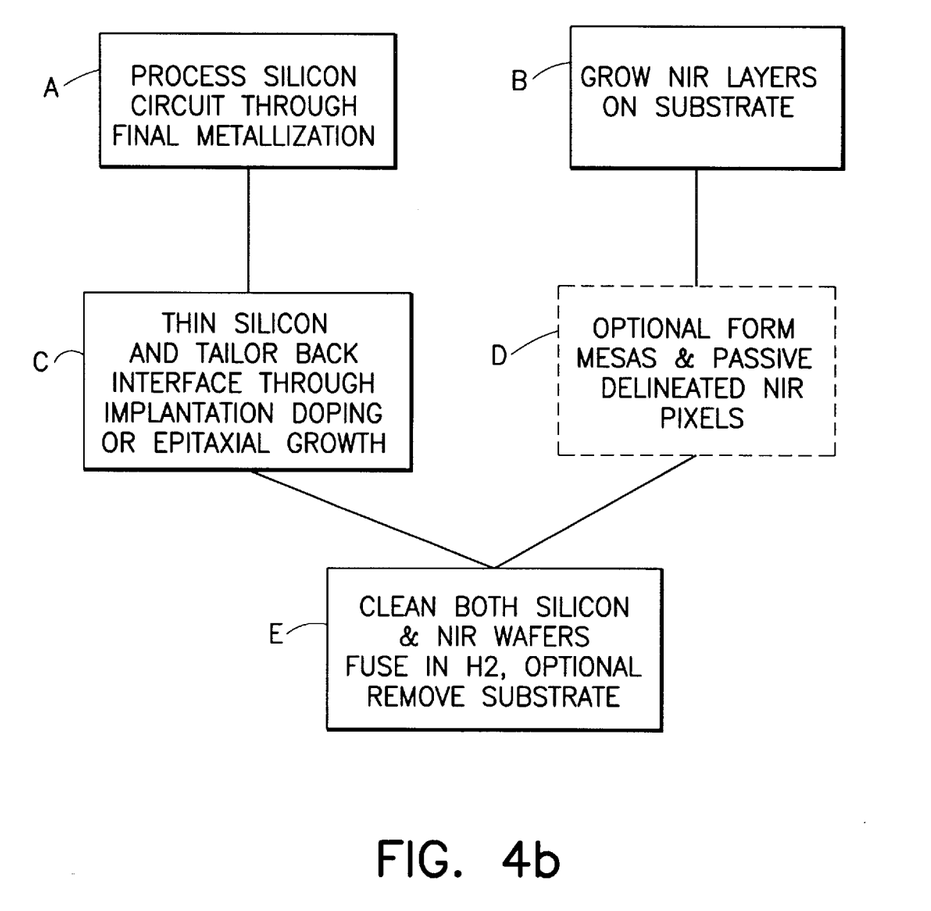
FIG. 4b is representative process flow diagram in accordance with a second method of this invention wherein refractory metallization is employed.

A $H_2$ atmosphere may be desirable for use when bonding an InGaAs layer 14 to the silicon layer 18. For CCD and CMOS circuits utilizing aluminum metallization, the aluminum interconnection layers and interlayer dielectrics are applied as needed subsequent to the fusing process, Block F. An alternate process that uses refractory metallization is shown in FIG. 4b, and thus enables the omission of this last step.

Figure 3:
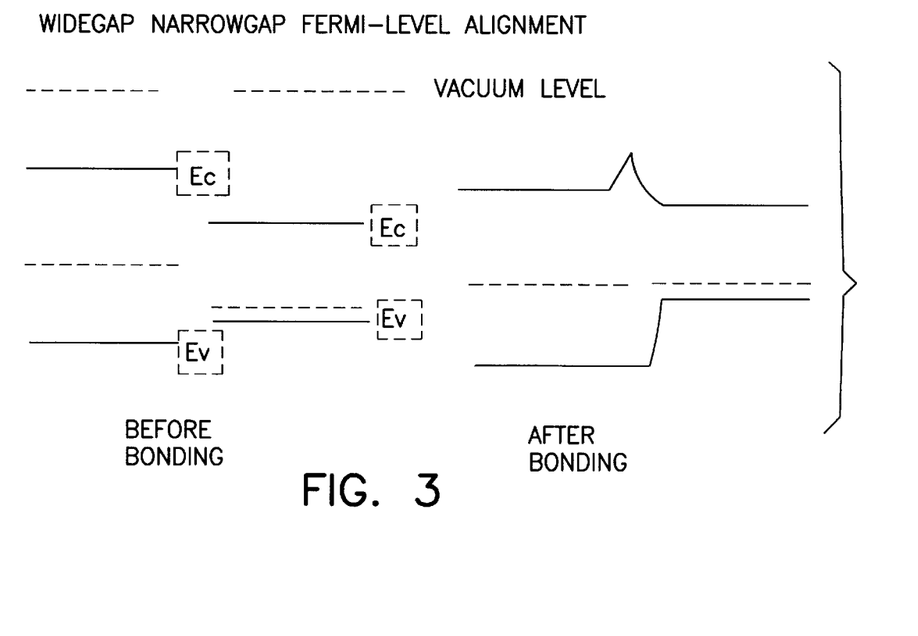
FIG. 3 is an energy bandgap diagram for representative semiconductor pairs for the heterojunction imager of FIGS. 1 and 2, both before and after bonding.

Certain tradeoffs may be required in the selection of the dissimilar semiconductor materials and in the bandgap engineering, i.e., the optimization of doping and bandgap grading, to attain charge carrier transport with minimal barriers. Reference in this regard can be made to FIG. 3, which represents the bandgap structure of InGaAs/Si or HgCdTe/Si interfaces. Optimization may involve a combination of an adjustment of Fermi levels through doping and bandgap optimization, and also the narrowing of the barrier to attain a low impedance tunneling contact. FIG. 3 shows a representation of a p–p isotype heterojunction with the wider bandgap semiconductor material (i.e., silicon). The lightly doped, wider bandgap silicon material that forms the substrate for CCD or CMOS circuits is preferably depleted with a relatively high electric field to facilitate the sweep-out of the charge carriers. The more heavily doped absorbing region, i.e, the detecting layer 14, is designed to achieve lower but finite electric fields to assist in the collection of charge carriers.

Furthermore, by adjusting the magnitude of electric fields across the imager 10 by means of photogate bias potentials, the imager 10 may be operated as an Avalanche Photodiode Imager (API) wherein amplification of the charge carrier signal is achieved through avalanche multiplication. An electric field strength in excess of 200 kV/cm is believed to be adequate to achieve the avalanche multiplication effect in the silicon layer 18.

By generating electrons and holes in the narrow bandgap material (e.g., a bonded layer of Group II–VI or Group III–V material) and then collecting the electrons in the wider bandgap silicon (p-silicon), a low noise avalanche gain (excess noise factor, F<4) can thus be achieved. Noise is further reduced by a negative feedback enabled by the collection of charge carriers under the integrating photogate 20a.

Figure 2:
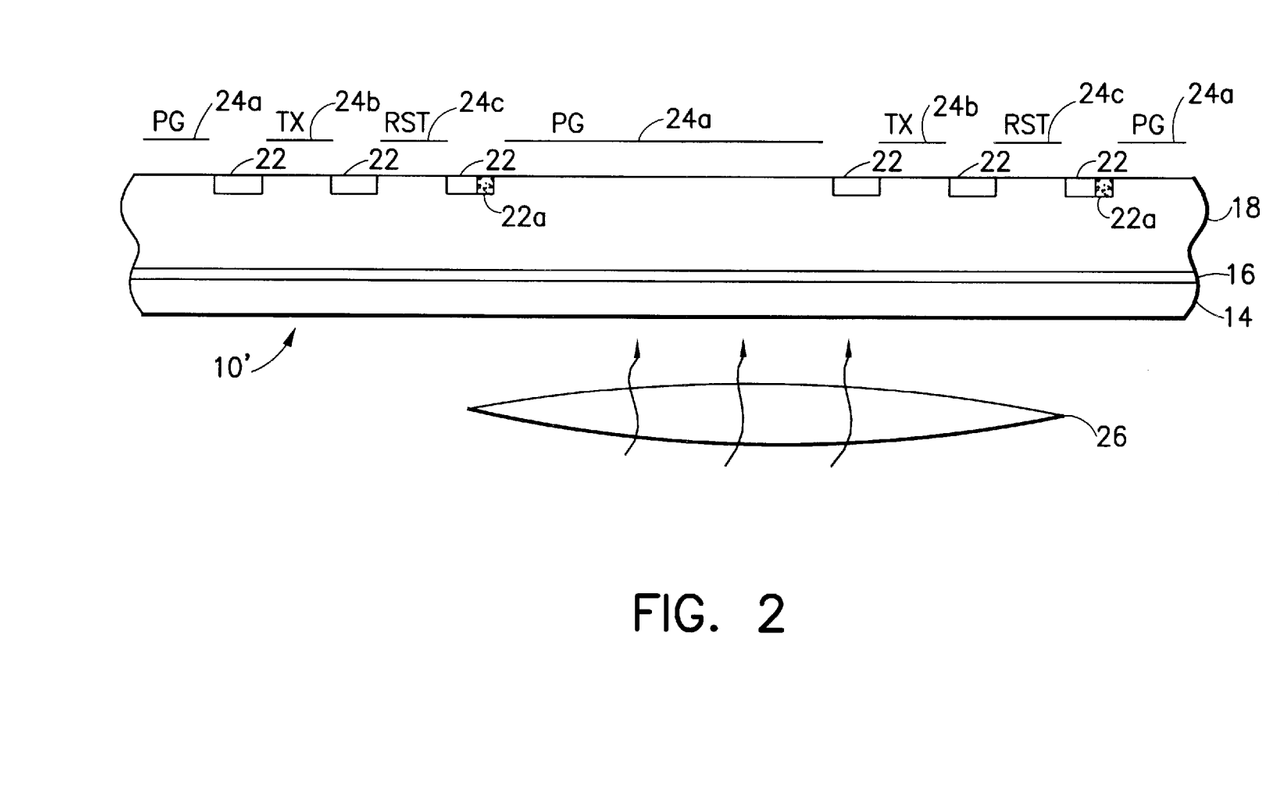
FIG. 2 is an enlarged, cross-sectional view (not to scale) of a CMOS embodiment of a heterojunction bonded imager in accordance with a second embodiment of this invention.

FIG. 2 is a CMOS embodiment of a heterojunction atomic bonded imager 10'. In the embodiment of FIG. 2 the narrow bandgap absorbing layer 14 is placed on a radiation receiving surface of the imager. This can be achieved by first growing the epitaxial layer on a sacrificial substrate and then removing all or most of the sacrificial substrate after the atomic bonding step. As in FIG. 1a, the heterojunction atomic bonding layer 16 resulting from the fusing process, which is only a few atomic diameters wide, links the NIR detecting layer 14 and the thinned silicon layer 18 and accommodates any lattice mismatch. This embodiment differs from the embodiment of FIG. 1a in that suitable source, gate, and drain diffusions 22 are placed in the surface of the silicon layer 18, and are connected to metallization that forms a photogate 24a, a transfer gate 24b, and a reset gate 24c. The diffusions 22a depict suitable isolation material.

In other respects, the operation of the imager 10' is similar to that of the imager 10 of FIG. 1a in that charge carriers resulting from the absorption of IR radiation in the detecting layer 14 are transported across the atomic bonding layer 16 and are collected under the photogate 24a. This embodiment also achieves the low noise charge mode collection of the charge carriers in a manner similar to the CCD embodiment of FIG. 1a. Furthermore, the spectral response of the silicon layer 18 is extended beyond the visible range into the infrared, such as the NIR.

FIG. 5 illustrates a CMOS embodiment of this invention wherein the heterojunction atomic bonding process at the wafer level can be used as an alternative to conventional individual readout and detector array indium bump technology. In this embodiment a silicon-based readout layer 18 is processed, thinned, and optionally a transition layer 16a is grown on or implanted in the opposite surface. By example, boron atoms (p-type dopant) can be implanted (e.g., 10–25 keV, $1-2\times10^{12}$ cm$^{-3}$) to form the transition layer 16a. A mating HgCdTe detecting layer 14 is grown epitaxially on a CdZnTe wafer substrate 12, and is then partitioned into a plurality of mesas 14a (for the case of diffusion injection of optically excited carriers). A layer of passivation 14b, such as a layer of wider bandgap semiconductor material (e.g., CdTe), is then applied to exposed side surfaces of the mesas 14a. A next step places the tops of the mesas 14a into contact with the transition layer 16a, pressure is applied, and the atomic bonding layer 16 is then formed at a temperature >400 C. in an inert atmosphere or one containing a critical gaseous component likely to be lost from the semiconductor components. Examples are mercury in the form of mercury vapor (for HgCdTe or other Hg containing semiconductors); arsenic in the form of arsine (for GaAs or other arsenic containing semiconductors); phosphorus in the form of phosphine (for InP or related phosphorus bearing semiconductors) or antimony bearing gaseous compounds (for GaSb or related semiconductors). Individual ones of the mesas 14a are positioned to generally underlie an individual one of the photogates 24a to reduce cross-talk and to provide a shortest possible path for charge carriers between the mesas 14a, where the IR-induced charge carriers are generated, and the photogates 24a where the charge carriers are collected. It should be noted that for the case of drift collected carriers, previously described, the delineation of the detecting layer 14 into the mesas 14a is not required.

It should be readily apparent that the embodiment illustrated in FIG. 5 differs from conventional indium bump technology in at least two important respects. First, no capping p+ layer is required to be grown on the detecting base layer (i.e., on the top surfaces of the mesas 14a). Second, the bonding can be performed on a wafer-scale basis, as opposed to indium-bumping individual die to readout chips.

In various embodiments of this invention, and as was illustrated in FIG. 2, the substrate 12 may be selectively removed. In this case proximal microlens arrays can be placed with spacers at the correct focal distance from the detecting array. One such microlens 26 is shown in FIG. 2. It is also within the scope of this invention to form the microlens array within the radiation receiving surface of the substrate 12, such as by photolithographically defining and then etching diffractive binary lens elements into the substrate surface.

The composite bonded detector and readout wafers may be further processed to add final metallization before being tested. The wafers are subsequently diced or laser scribed to obtain composite die, each of which is operable as an imaging array.

The teachings of this invention have specific application to the monolithic integration of NIR and visible imaging technologies at densities compatible with <10 $\mu$m unit cell sizes, and with photon detection limits well below 100 photons per video frame time. Large arrays, e.g., 1000×1000 unit cells or pixels, which bond the NIR detecting layer 14 and the silicon-based backside illuminated and thinned CCD, can provide 100× the sensitivity of conventional image intensifiers. This is true because the invention takes advantage of the 100× higher atmospheric radiation in the NIR. Furthermore, with suitable tailoring of heterojunction interfaces the novel imager structure can be implemented on a wafer level as a low cost alternative to the conventional use of die-level indium bump interconnections. More particularly, this invention provides the capability of wafer-level bonding of dissimilar materials with differing bandgaps, thereby replacing conventional IR-FPA indium bump hybridization and reducing the cost while increasing the reliability of the IR-FPA. The use of this invention furthermore eliminates at least one growth step, i.e., the capping layer of the narrow bandgap detector that is grown prior to the application of the indium bumps during the hybridization process.

The enhanced sensitivity made possible by this invention may further enable an effective 10x increase in detection range.

This invention furthermore improves on conventional IR-FPA architectures, specifically in low light level operation, by enabling CMOS or CCD backside illuminated architectures that exhibit essentially noiseless resetting (i.e., eliminating "KTC" noise).

The imagers 10 and 10' can be modified to detect longer wavelength radiation by substituting layers with longer wavelength cutoff (i.e. SWIR, MWIR or LWIR) for the NIR layer 14. Providing the substrate with a cutoff in the visible enables the selective detection of NIR or longer wavelengths without detecting the visible. Alternatively, by etching off the substrate both the visible and longer wavelength bands can be simultaneously detected and readout. The separate detection and collection of both the visible and NIR (or longer wavelengths) can be achieved as previously described through the selective etching of a portion of the NIR detecting layer of each pixel element subsequent to removal of the substrate. The combination of this delineation and the two photogates 20a' and 20a'' within each unit cell 11 thus enables color separation.

In the practice of this invention the choice of doping levels and types can vary widely. In general, the doping of the layers of either or both semiconductors can range from $1\times10^{13}$ to $1\times10^{19}$ cm$^{-3}$. The selected value depends on the engineering of the interfaces and the device design. For example, the region near the interface may be doped to tailor the fields, i.e., maintaining a high field in the CCD or CMOS circuit to collect charge while reducing the field in the absorbing layer (e.g., InGaAs) to maintain the "field-assisted" dark current at a low level. This doping may also enable passivation of active defects in the atomic fused layer 16. This interface passivation doping can include doping of the interface after the fusion with, by example, a mobile species such as hydrogen in atomic, radical or molecular forms.

As an example, consider fusing a backthinned CCD to an InGaAs detector. This composite imager may involve the following doping sequence: (1) a lightly doped p-type layer $1\times10^{13}$ to $1\times10^{15}$ cm$^{-3}$ which is depleted 5–15 $\mu$m; (2) a more heavily doped p-type $1\times10^{16}$ to $1\times10^{19}$ cm$^{-3}$ (boron doping) (1–5 $\mu$m); (3) an InGaAs absorbing layer (~1–5 $\mu$m) lightly doped n or p (~$1\times10^{13}$ to $1\times10^{16}$ cm$^{-3}$); (4) a final wide bandgap InP p+ layer in the silicon; and (5) a lightly doped InP substrate 12. As an alternative or adjunct to the p+ layer in the silicon, a thin wideband semiconductor such as InP doped p+ may be grown at the absorber side of the interface to provide field reduction or passivation of the atomic fusing layer.

The inventors have thus taught embodiments of imaging circuits resulting from the fusion (or bonding) of two materials. One material absorbs radiation; and the second material collects photogenerated carriers in an array of individual cells (pixel elements) and "reads out" the image resulting from the photogenerated carriers collected in each pixel. The output may be in various forms, such as charge packets, voltages, or currents. The materials that comprise the absorbing layer and readout layer may be dissimilar or the same.

In some cases it may be advantageous to extend the wavelength response of a silicon-based imager by fusing same to a semiconductor material having a longer wavelength response. Exemplary materials are Group II–VI materials, such as HgCdTe; Group II–IV materials, such as PbSe, PbS or PbTe; Group III–V materials, such as InGaAs or GaSb; and Group IV materials, such as Ge or $Ge_xSi_{1-x}$.

However, in other cases the absorber material of layer 14 may be a wider bandgap material, such as GaAs; InP; SiC, BN or diamond. In these cases advantages may accrue by nature of these layers having a very high absorption coefficient for specific radiation. Coupling such materials to very low noise readouts enables large format arrays to be fabricated. As an example, although silicon can detect UV radiation much of this radiation is lost due to recombination at the interface "dead layer". By fusing a thin layer of wider bandgap material to the silicon, such as BN or diamond with a high absorption coefficient for UV, the UV radiation is converted to carriers which then diffuse or drift under the influence of fields into the silicon. The "dead layer" in this case is replaced by the atomically abrupt bonding layer 16.

The fused imager structure of this invention can employ either CMOS or CCD circuit designs and processes consistent with state of the art low noise analog imaging readouts. These include those circuits developed for both infrared-based and visible imagers. For these embodiments the CMOS and CCD may be implemented in silicon or alternatively in III–V materials. For the case of silicon CMOS or CCD circuit embodiments, active source/drains are typically doped to the range $1 \times 10^{17}$ to $1 \times 10^{20}$ cm$^{-3}$, gate and field dielectric thicknesses are typically 200–1000 Å and 5000–10,0000 Å, respectively ($SiO_2$ or $Si_3N_4$), and may contain multiple gate or interconnection layers typically comprised of polycrystalline silicon ("poly") which may be "silicided" with a metal such as Pt, Pd or W to increase its conductivity. The widths of diffusions and gates are typically in the range 0.5–10 μm. The final interconnecting layers may utilize aluminum or its alloys with silicon, copper, or a combination of silicon and copper. The final aluminum metallization steps may advantageously be performed after the fusing process, since for temperatures above 550 C. aluminum will melt and may preferentially alloy with the underlying silicon causing a "spiking" of junctions. This deleterious effect can be completely avoided by fusing prior to the final metallization. An alternate process utilizes an entirely refractory metallization process (see FIG. 4b), such as that achieved utilizing: silicides—PtSi; PdSi or WSi; conductive nitrides such as MoN, TiN or TaN; or refractory metals alone, such as Pt, Pd, W, Ti, Mo, Ta, Au, and Ag.

Thus, although described above with respect to specific semiconductor and other material types, thicknesses, dopants, etc., it should be realized that these are to be viewed as exemplary and not in a limiting sense. Furthermore, certain of the steps depicted in FIGS. 4a and 4b could be performed in other than the order shown while still achieving the same result.

Thus, while the invention has been particularly shown and described with respect to preferred embodiments thereof, it will be understood by those skilled in the art that changes in form and details may be made therein without departing from the scope and spirit of the invention.

What is claimed is:

1. An imaging device having a plurality of unit cells that contribute to forming an image of a scene, said imaging device comprising a first layer of semiconductor material having, for each unit cell, low noise photogate readout circuitry disposed adjacent to a first surface of said first layer, a second, opposing surface of said first layer being atomically bonded at a heterojunction interface to a surface of a second layer of semiconductor material having an atomic spacing dissimilar to that of said first layer of semiconductor material and selected for absorbing electromagnetic radiation having wavelengths longer than about one micrometer and for generating charge carriers, the generated charge carriers being transported across said atomically bonded heterojunction interface for collection by said photogate readout circuitry.

2. An imaging device as set forth in claim 1, wherein said first layer of semiconductor material is comprised of silicon.

3. An imaging device as set forth in claim 1, wherein said second layer of semiconductor material is comprised of one of a Group III–V semiconductor material, a Group II–VI semiconductor material, a Group II–IV semiconductor material, and a Group IV semiconductor material.

4. An imaging device as set forth in claim 1, wherein each of said unit cells is comprised of a plurality of photogates for collecting charge carriers resulting from absorption of radiation within at least two spectral bands.

5. An imaging device as set forth in claim 1, wherein said second layer of semiconductor material is disposed upon a surface of a transparent substrate.

6. An imaging device having a plurality of unit cells that contribute to forming an image of a scene, said imaging device comprising a first layer of semiconductor material having, for each unit cell, low noise photogate readout circuitry disposed adjacent to a first surface of said first layer, a second layer of semiconductor material differentiated into a plurality of mesa structures, and wherein said first layer of semiconductor material is atomically bonded to top surfaces of each of said plurality of mesa structures, said second layer of semiconductor material being selected for absorbing electromagnetic radiation having wavelengths longer than about one micrometer and for generating charge carriers, the generated charge carriers being transported across said atomically bonded heterojunction interface for collection by said photogate readout circuitry.

7. An imaging device as set forth in claim 6, wherein side-wall surfaces of said plurality of mesa structures are disposed beneath a layer of passivation.

8. An imaging device as set forth in claim 1, wherein said second layer of semiconductor material is a layer that is epitaxially grown upon a surface of a substrate, and wherein said substrate is subsequently one of retained, thinned, or removed.

9. An imaging device as set forth in claim 1, and further comprising means for establishing an electric field at least through said first layer of semiconductor material for facilitating the collection of said charge carriers by said photogate readout circuitry.

10. An imaging device as set forth in claim 1, and further comprising means for establishing an electric field at least through said first layer of semiconductor material for amplifying said charge carriers within said first layer of semiconductor material by avalanche multiplication.

11. An imaging device as set forth in claim 1, and further comprising a plurality of microlenses individual ones of which are disposed for concentrating incident electromagnetic radiation into said second layer of semiconductor material.

12. An imaging device as set forth in claim 1, wherein said low noise photogate readout circuitry is comprised of CCD readout circuitry.

13. An imaging device as set forth in claim 1, wherein said low noise photogate readout circuitry is comprised of CMOS readout circuitry.

14. An imaging device comprising an array of unit cells individual ones of which contribute to forming an image of a scene, comprising:

a first layer of semiconductor material having a bandgap selected for absorbing electromagnetic radiation having wavelengths in the near IR or longer for generating charge carriers from the absorbed electromagnetic radiation;

a second layer of semiconductor material having a bandgap selected to be wider than the bandgap of said first layer;

said first and second layers of semiconductor material having dissimilar atomic spacing and being physically and electrically coupled together along opposing surfaces thereof with an atomically bonded interface; and a plurality of charge-mode readout circuits disposed adjacent to a surface of said second layer of semiconductor material that is opposite said atomically bonded interface, individual ones of said plurality of charge-mode readout circuits defining a single unit cell readout operable for collecting the charge carriers that are generated at least within an underlying portion of said first layer and that cross through said atomically bonded interface and through an intervening portion of said second layer of semiconductor material.

15. An imaging device as set forth in claim 14, wherein said second layer of semiconductor material is comprised of silicon, and wherein said first layer of semiconductor material is comprised of one of a Group III–V semiconductor material, a Group II–VI semiconductor material, a Group II–IV semiconductor material, and a Group II semiconductor material.

16. An imaging device as set forth in claim 14, wherein said plurality of charge-mode readout circuits are comprised of CCD readout circuitry.

17. An imaging device as set forth in claim 14, wherein said plurality of charge-mode readout circuits are comprised of CMOS readout circuitry.

* * * * *